(12) United States Patent
Choi et al.

(10) Patent No.: US 9,424,932 B2
(45) Date of Patent: Aug. 23, 2016

(54) NONVOLATILE MEMORY DEVICE AND PROGRAMMING METHOD THEREOF

(71) Applicants: Yoon-Hee Choi, Hwaseong-Si (KR); Sang-Wan Nam, Hwaseong-Si (KR); Kang-Bin Lee, Suwon-Si (KR)

(72) Inventors: Yoon-Hee Choi, Hwaseong-Si (KR); Sang-Wan Nam, Hwaseong-Si (KR); Kang-Bin Lee, Suwon-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/567,639

(22) Filed: Dec. 11, 2014

(65) Prior Publication Data

US 2015/0221376 A1 Aug. 6, 2015

(30) Foreign Application Priority Data

Feb. 3, 2014 (KR) .................... 10-2014-0012170

(51) Int. Cl.

| | |
|---|---|
| *G11C 11/34* | (2006.01) |
| *G11C 16/10* | (2006.01) |
| *G11C 16/04* | (2006.01) |
| *G11C 16/34* | (2006.01) |
| *G11C 7/04* | (2006.01) |
| *H01L 27/115* | (2006.01) |

(52) U.S. Cl.
CPC ........ *G11C 16/10* (2013.01); *G11C 7/04* (2013.01); *G11C 16/0483* (2013.01); *G11C 16/3459* (2013.01); *H01L 27/1157* (2013.01); *H01L 27/11575* (2013.01); *H01L 27/11582* (2013.01)

(58) Field of Classification Search
CPC ....................... G11C 16/0491; G11C 16/34

USPC ............. 365/185.16, 185.18, 185.23, 185.25, 365/185.26

See application file for complete search history.

(56) References Cited

U.S. PATENT DOCUMENTS

| | | | |
|---|---|---|---|
| 6,614,688 B2 | 9/2003 | Yeom et al. | |
| 7,719,902 B2 | 5/2010 | Dong et al. | |
| 7,817,472 B2 * | 10/2010 | Kuo .................... | G11C 16/0416 365/185.12 |
| 7,957,191 B2 | 6/2011 | Chung | |
| 8,208,306 B2 | 6/2012 | Pyeon et al. | |
| 8,238,153 B2 | 8/2012 | Lee | |
| 8,427,881 B2 | 4/2013 | Jang et al. | |
| 8,537,617 B2 | 9/2013 | Kim et al. | |
| 2008/0037326 A1 | 2/2008 | Kim et al. | |
| 2011/0051527 A1 * | 3/2011 | Kirisawa ............ | G11C 16/0483 365/185.29 |
| 2011/0211392 A1 | 9/2011 | Kim et al. | |
| 2012/0063235 A1 * | 3/2012 | Yoon .................. | G11C 16/3418 365/185.23 |
| 2013/0080718 A1 * | 3/2013 | Huh .................... | G06F 12/0207 711/154 |

FOREIGN PATENT DOCUMENTS

| | | |
|---|---|---|
| KR | 10-2009-0096876 A | 9/2009 |
| KR | 10-2011-012-0467 A | 11/2011 |

* cited by examiner

*Primary Examiner* — Han Yang
(74) *Attorney, Agent, or Firm* — Volentine & Whitt, PLLC

(57) ABSTRACT

A programming method is for programming a nonvolatile memory device including a plurality of strings disposed perpendicular to a substrate and connected between bitlines and a common source line. The programming method includes setting up the common source line to a predetermined voltage, floating the setup common source line, performing a program operation on memory cells connected to a selected wordline, and performing a verify operation on the memory cells.

20 Claims, 18 Drawing Sheets

NONVOLATILE MEMORY DEVICE AND PROGRAMMING METHOD THEREOF

CROSS-REFERENCE TO RELATED APPLICATIONS

A claim of priority under 35 USC §119 is made to Korean Patent Application No. 10-2014-0012170, filed on Feb. 3, 2014, the entirety of which is hereby incorporated by reference.

BACKGROUND

Embodiments of the present disclosure relate to nonvolatile memory devices and programming methods thereof.

In general, semiconductor memory devices are classified as either volatile semiconductor memory devices or nonvolatile semiconductor memory devices. In contrast to volatile memory device, nonvolatile memory devices can retain their stored data even when their power supplies are interrupted. Data stored in a nonvolatile memory device may be permanent or reprogrammed according to memory fabrication technology. Nonvolatile memory devices are used for program and microcode storage in a wide variety of applications in the computer, avionics, telecommunications, and consumer electronics industries.

SUMMARY

The present disclosure provides a nonvolatile memory device and a programming method thereof.

Embodiments of the disclosure provide a programming method of a nonvolatile memory device including a plurality of strings disposed perpendicular to a substrate between bitlines and a common source line. In some embodiments, the programming method may include setting up the common source line to a predetermined voltage, floating the setup common source line, performing a program operation on memory cells connected to a selected wordline, and performing a verify operation on the memory cells.

Embodiments of the disclosure provide a nonvolatile memory device. In some embodiments, the nonvolatile memory device may include a memory cell array including a plurality of memory blocks including a plurality of strings disposed perpendicular to a substrate and coupled between bitlines and a common source line, an address decoder configured to select any one of the memory blocks in response to an address, an input/output circuit configured to store data to be programmed into memory cells connected to a selected one of wordlines of the selected memory block during a program operation or store data read from memory cells connected to the selected wordline during a verify operation, a common source line driver configured to float the common source line after setting up the common source line to a predetermined voltage, and a control logic configured to control the address decoder, the input/output circuit, and the common source line driver during the program operation and the verify operation.

Embodiments of the disclosure provide a storage device. In some embodiments, the storage device may include at least one nonvolatile memory device including a plurality of memory blocks each including a plurality of strings formed in a direction perpendicular to a substrate and connected between bit lines and a common source line and a memory controller configured to control the at least one nonvolatile memory device, wherein the common source line is set to a predetermined voltage and then is floated in a program operation.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain principles of the disclosure. In the drawings.

DETAILED DESCRIPTION

Figure 1:
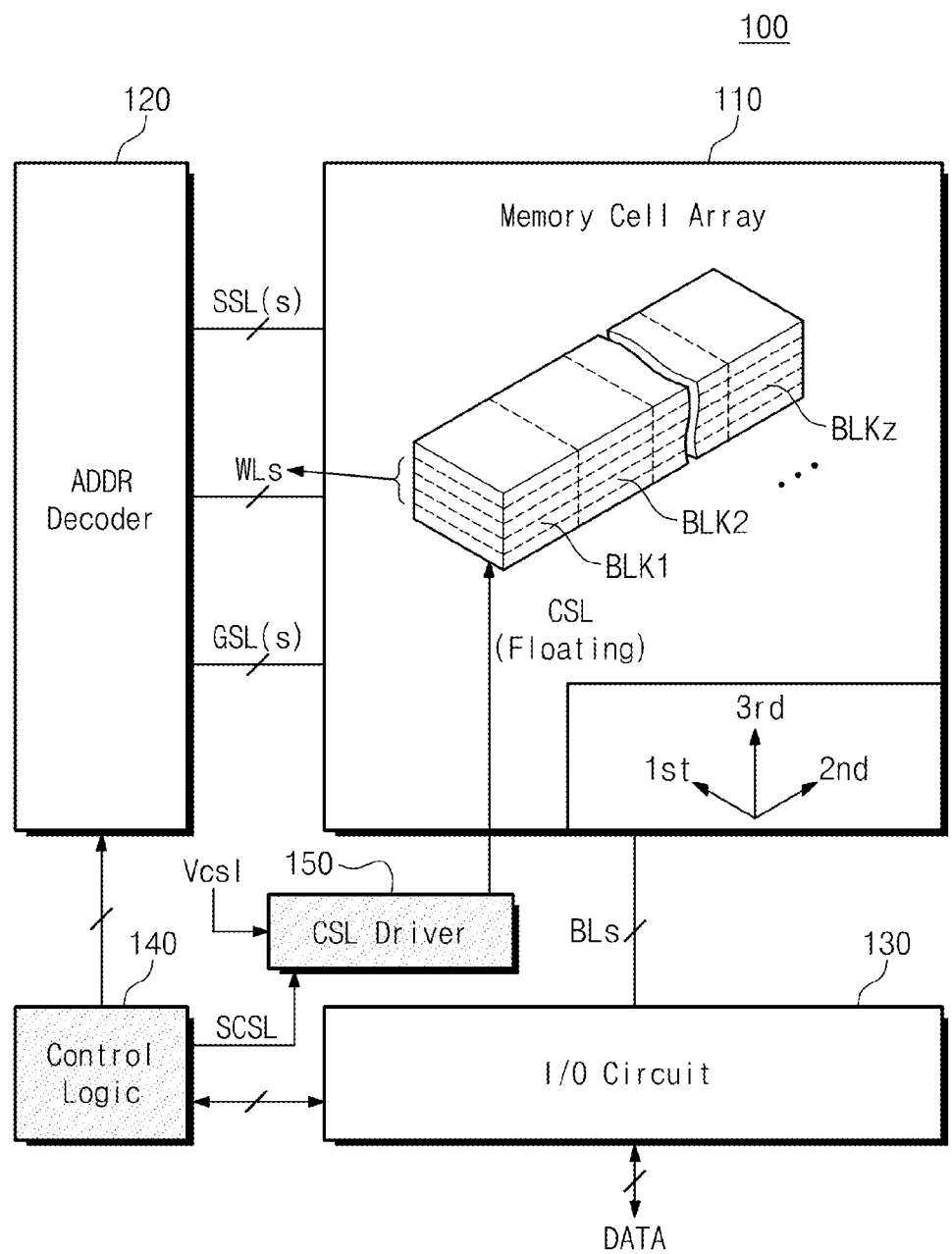
FIG. 1 illustrates a nonvolatile memory device according to an exemplary embodiment of the inventive concept.

Embodiments of the inventive concept will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 illustrates a nonvolatile memory device 100 according to an exemplary embodiment of the inventive concept. As illustrated, the nonvolatile memory device 100 includes a memory cell array 110, an address decoder 120, an input/output (I/O) circuit 130, a control logic 140, and a CSL driver 150.

The nonvolatile memory device 100 may be a NAND flash memory, a vertical NAND (VNAND), a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM) or the like. In addition, the nonvolatile memory device 100 may be implemented using a three-dimensional (3D) array structure. The inventive concept may be applied to not only a flash memory device in which a charge storage layer includes a conductive floating gate but also a charge trap flash (CTF) memory device in which a charge storage layer includes an insulating layer. For the brevity of description, the nonvolatile memory device 100 will be referred to as a vertical NAND flash memory device (VNAND).

The memory cell array 110 includes a plurality of memory blocks BLK1 to BLKz (z being an integer equal to or greater than 2). Each of the memory blocks BLK1 to BLKz is connected to the address decoder 120 through wordlines WLs, at least one string selection line SSL, and at least one ground selection line GSL and is connected to the I/O circuit 130 through bitlines BLs. The wordlines WLs may be implemented in the form of stacked plates.

Each of the memory blocks BLK1 to BLKz includes a plurality of three-dimensional strings arranged in a first direction and a second direction (differing from the first direction) on a substrate and arranged in a third direction (perpendicular to a plane formed in the first direction and the second direction). Each of the strings includes at least one selection transistors, a plurality of memory cells, and at least one ground selection transistors which are coupled in series between a bitline and a common source line CSL. Each of the memory cells may store at least one bit. In some embodiments, at least one dummy cell may be included between at least one string selection transistor and a plurality of memory cells. In other embodiments, at least one dummy cell may be included between a plurality of memory cells and at least one ground selection transistor.

The address decoder 120 may select one of the memory blocks BLK1 to BLKz in response to an address. The address decoder 120 is connected to the memory cell array through wordlines WLs, at least one string selection line SSL, and at least one ground selection line GSL. The address decoder 120 selects the wordlines WLs, the string selection line SSL, and the ground selection line GSL using a decoded row address. The address decoder 120 may decode a column address among input addresses. The decoded column address may be transferred to the I/O circuit 130. In some embodiments, the address decoder 120 may include a row decoder, a column decoder, an address buffer, and the like.

The I/O circuit 130 is connected to the memory cell array 110 through bitlines BLs. The I/O circuit 130 may be implemented to receive the decoded column address from the address decoder 120. The I/O circuit 130 may select the bitlines BLs using the decoded column address.

The I/O circuit 130 receives data from an external entity (e.g., memory controller) and stores the received data in the memory cell array 110. The I/O circuit 130 may read data from the memory cell array 110 and output the read data to an external entity. The I/O circuit 130 may read data from a first region of the memory cell array 110 and store the read data in a second region of the memory cell array 110. For example, the I/O circuit 130 may be implemented to perform a copyback operation.

The control logic 140 controls the overall operation (program/read/erase operations, etc.) of the nonvolatile memory device 100. The control logic 140 may operate in response to externally input control signals or command.

In some embodiments, the control logic 140 may generate a CSL control signal SCSL to control the CSL driver 150. The CSL control signal SCSL may be generated based on environmental information such as a temperature, an operating mode, the number of program loops, time, and the like.

The CSL driver 150 may be supplied with a CSL voltage Vcs1 and supply a voltage corresponding to the CSL voltage Vcs1 to a common source line CSL. The CSL driver 150 may float the CSL in response to the CSL control signal SCSL. For example, the CSL control signal SCSL be provided to the CSL driver 150 to float the CSL after setting up a CSL level to a predetermined value during a program operation. In addition, the CSL control signal SCSL may be provided to the CSL driver 150 to float the CSL when predetermined time has passed after setting up the CSL level to a predetermined value during a program operation.

A general nonvolatile memory device is maintained at a CSL setup state to enhance boosting efficiency during a program operation. However, the level of bitlines may rise due to coupling between the CSL and bitlines. Thus, incremental step pulse programming (ISPP) effect may be reduced to decrease program speed.

In the meantime, according to the above-described nonvolatile memory device 100, a CSL is set up and then floated during a program operation to prevent coupling between the CSL and bitlines. Thus, program speed of the nonvolatile memory device 100 may be improved as compared to that of a conventional nonvolatile memory device. Moreover, the CSL is floated during the program operation to reduce consumption of power supplied to the CSL.

Figure 2:
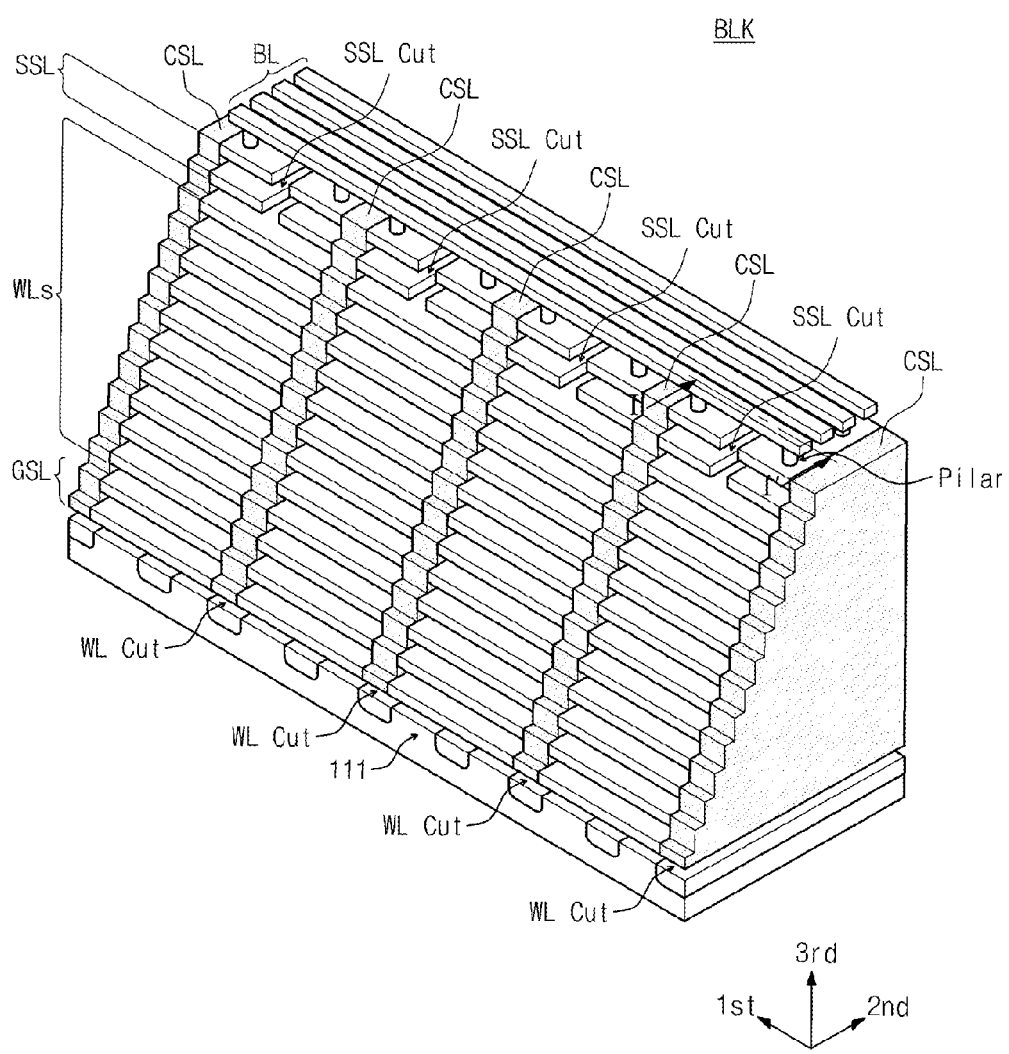
FIG. 2 illustrates an example of a memory block in FIG. 1.

FIG. 2 illustrates an example of a memory block BLK in FIG. 1. Referring to FIG. 2, four sub-blocks are formed on a substrate 111. Each of the sub-blocks is formed by stacking at least one ground selection line GSL, a plurality of wordlines WLs, and at least one string selection line SSL in the form of a plate between wordline cuts on the substrate 111. The at least one string selection line SSL is divided into string selection line cuts. A wall-shaped common source line CSL may be formed inside each wordline cut.

In some embodiments, at least one dummy wordline may be stacked in the form of a plate between a ground selection line GSL and wordlines WLs or at least one dummy wordline may be stacked in the form of a plate between wordlines WLs and a string selection line SSL.

Although not shown in this figure, each wordline cut includes a common source line CSL. In some embodiments, a common source line included in each wordline cut is commonly connected. A pillar connected to a bitline penetrates at least one ground selection line GSL, a plurality of wordlines WLs, and at least one string selection line SSL to form a string.

As shown in FIG. 2, a target between wordline cuts is a sub-block. However, the inventive concept is not limited thereto. In the inventive concept, a target between a wordline cut and a string selection line cut is named a sub-block.

A block BLK according to an embodiment of the inventive concept may be implemented using a structure in which two wordlines are merged into one, i.e., a merged wordline structure.

Figure 3:
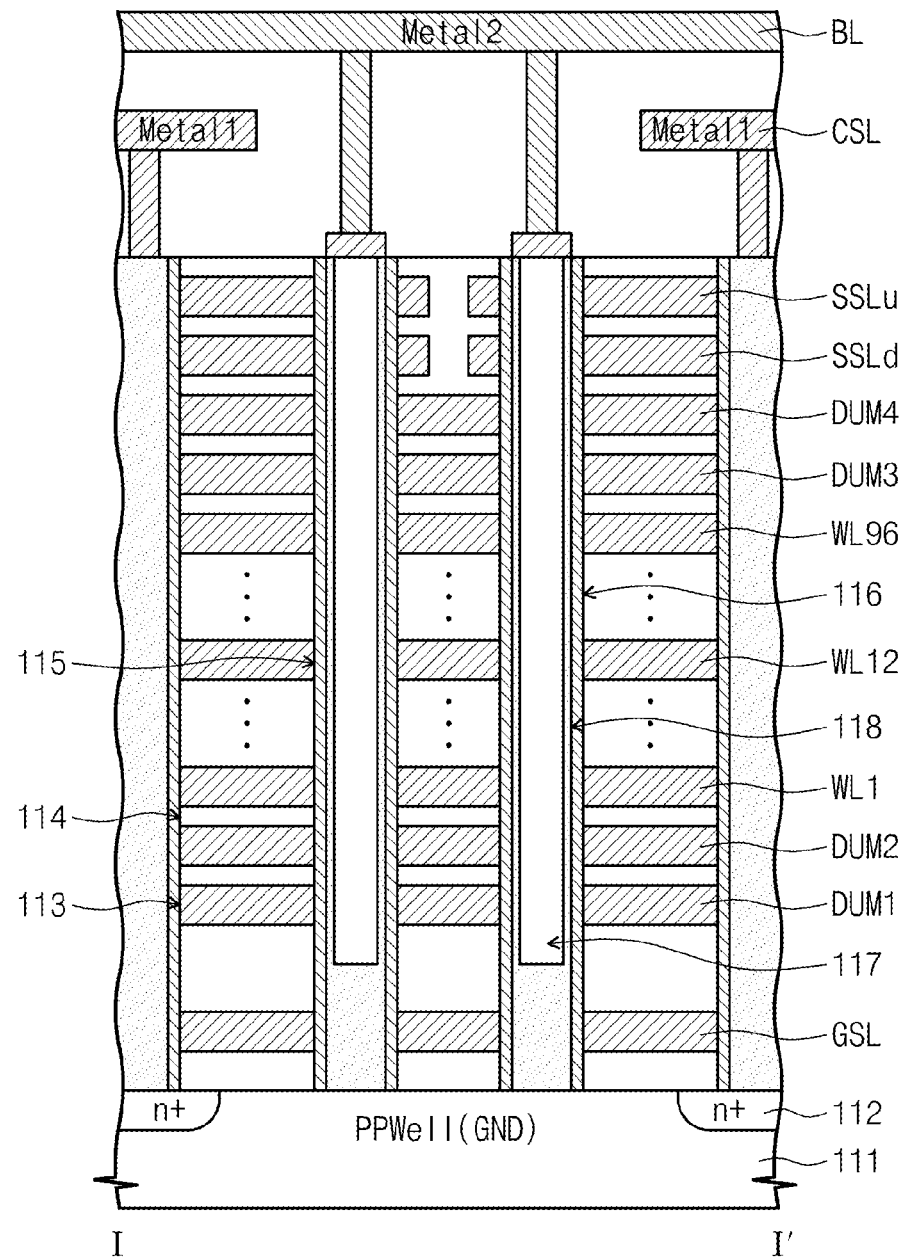
FIG. 3 illustrates a portion of a cross-sectional view of the memory block in FIG. 2.

FIG. 3 illustrates a portion of a cross-sectional view of the memory block BLK in FIG. 2. As illustrated, the memory block BLK is formed in a direction perpendicular to the substrate 111. An n+ doped region 112 is formed on the substrate 111.

Gate electrode layers 113 and insulating layers 114 are alternately deposited on the substrate 111. In some embodiments, an information storage layer 115 may be formed on side surfaces of the gate electrode layers 113 and the insulating layers 114.

The gate electrode layer 113 may be connected to a ground selection line GSL, a plurality of wordlines WL1 to WL8, and a string selection line SSL.

The information storage layer 115 may include a tunnel insulating layer, a charge storage layer, and a block insulating layer. The tunnel insulating layer may act as an insulating layer in which charges may travel due to tunneling effect. The charge storage layer may include an insulating layer to trap charges. The charge storage layer may be made of, for example, nitride (SiN) or metal oxide (aluminum oxide or hafnium oxide). The blocking insulating layer may act as an insulating layer between the gate electrode layer and the charge storage layer. The blocking insulating layer may be made of silicon oxide. The tunnel insulating layer, the charge storage layer, and the blocking insulating layer may be made of an insulating layer having an oxide-nitride-oxide (ONO) structure.

A pillar 116 may be formed by vertically patterning the gate electrode layer 113 and the insulating layer 114.

The pillar 116 is coupled between a bitline and the substrate 111 through the gate electrode layer 113 and the insulating layer 114. The inside of the pillar 116 may be a filling dielectric pattern 117 which is made of an insulating material such as silicon oxide or an air gap. The outside of the pillar 116 may be a vertical active pattern 118 which includes a channel semiconductor. In some embodiments, the vertical active pattern 118 may be made of p-type silicon. A certain single memory cell included in a string may include a charge dielectric pattern 117, a vertical active pattern 118, the charge storage layer 115, and the gate electrode layer 113 that are sequentially disposed from the inside of the pillar 116.

Common source lines CSL extend on the n+ doped regions 112. The common source line CSL may be included in the form of a well inside a wordline cut.

Figure 4:
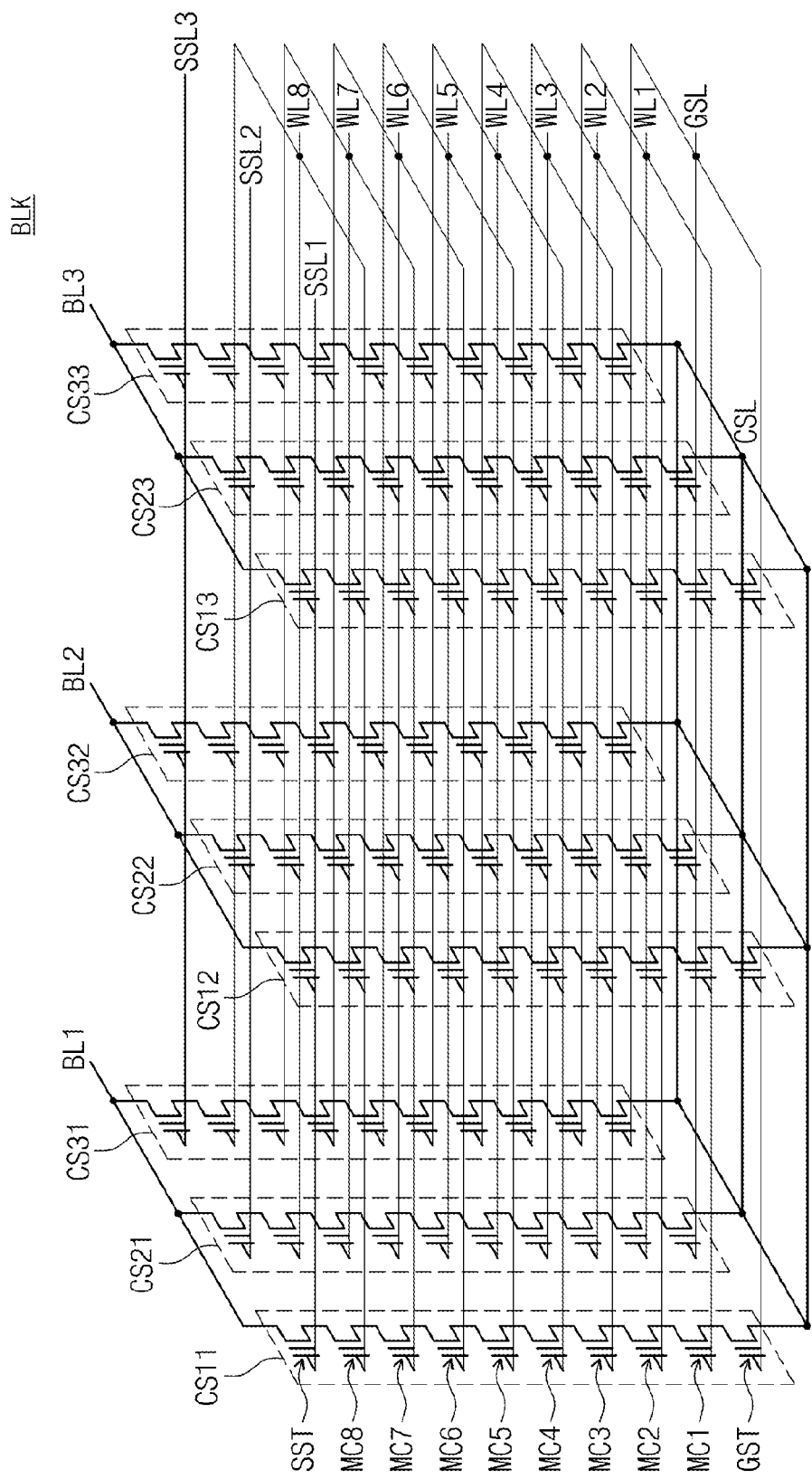
FIG. 4 is an exemplary equivalent circuit diagram of the memory block in FIG. 2.

FIG. 4 is an exemplary equivalent circuit diagram of the memory block BLK in FIG. 2. As illustrated, cell strings CS11 to CS33 are coupled between bitlines BL1 to BL3 and a common source line CSL. Each of the cell strings (e.g., CS11) may include a ground selection transistor GST, a plurality of memory cells MC1 to MC8, and a string selection transistor SST. For the convenience of description, let it be assumed that the number of memory cells included in a string is eight. However, the number of memory cells included in a string according to the inventive concept is not limited thereto.

The string selection transistor SST is connected to a string selection line SSL. The string selection line SSL is divided into first to third string selection lines SSL1 to SSL3. In FIG. 4, three string selection lines SSL1 to SSL3 connected to a single bitline are shown. However, the inventive concept is not limited thereto. The memory block BLK according to the inventive concept may include at least two string selection lines corresponding to a single bitline.

The ground selection transistor GST is connected to a ground selection line GSL. Ground selection lines GSL of respective cell strings are connected. The string selection transistor SST is connected to a bitline BL, and the ground selection transistor GST is connected to a common source line CSL.

The memory cells MC1 to MC8 may be connected to corresponding wordlines WL1 to WL8, respectively. A set of memory cells connected to a single wordline and programmed at the same time is referred to as a page. A memory block BLK1 includes a plurality of pages. A plurality of pages may be connected to a single wordline. Referring to FIG. 4, a wordline (e.g., WL4) is commonly connected to three pages from the common source line CSL.

Each memory cell may store one a single bit of data or two or more bits of data. A memory cell for storing a single bit of data is referred to as a single-level cell (SLC) or a single-bit cell. A memory cell for storing two or more bits of data is referred to as a multi-level cell (MLC) or a multi-bit cell. In case of a two-bit MLC, two pages of data are stored in a single physical page. Thus, two pages of data may be stored in a memory cell connected to the fourth wordline WL4.

On the other hand, the nonvolatile memory device 100 may be implemented using a charge trap flash (CTF) memory device. In this case, charges trapped to a programmed CTF memory device may be redistributed and lost, i.e., initial verify shift (IVS) occurs with the lapse of time. A reprogramming operation may be performed to overcome such distribution degradation.

The memory block BLK in FIG. 4 has a structure in which a ground selection line GSL is shared. However, the inventive concept need not be limited thereto. The ground selection line GSL of the inventive concept may be implemented with a divided structure, similarly to a string selection line.

Figure 5:
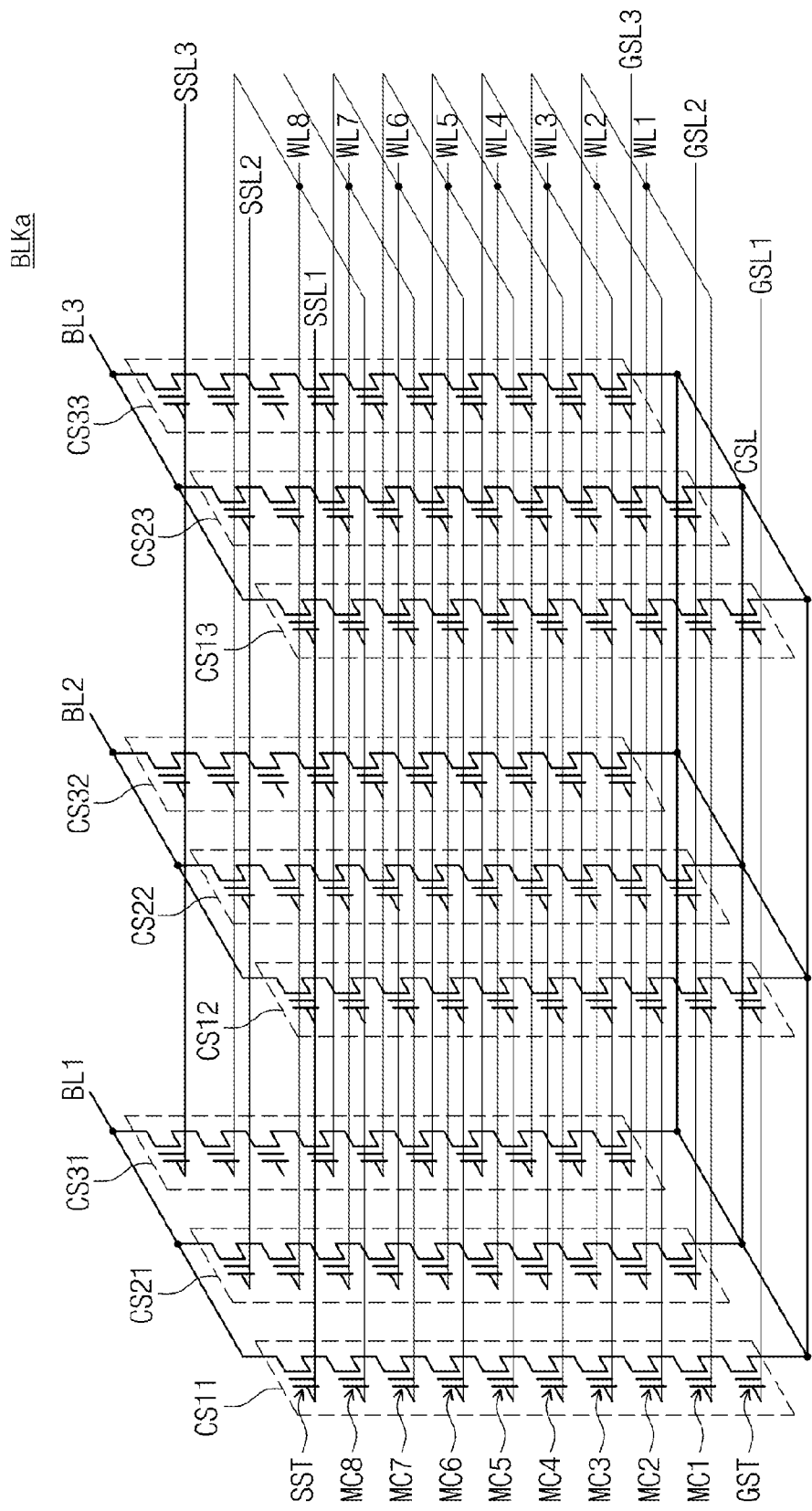
FIG. 5 illustrates another embodiment of the equivalent circuit diagram of the memory block in FIG. 2.

FIG. 5 illustrates another embodiment of the equivalent circuit diagram of the memory block BLK in FIG. 2. As illustrated, a memory block BLKa includes divided ground selection lines GSL1, GSL2, and GSL3 as compared to the memory block BLK in FIG. 4. The number of the divided ground selection lines GSL1 to GSL3 shown in FIG. 5 is three. However, the inventive concept is not limited thereto. The memory block BLKa of the inventive concept may include at least two ground selection lines.

In the memory blocks shown in FIGS. 2 to 5, a string is formed between a substrate 111 and a bitline. However, a structure of the string of the inventive concept is not limited thereto. The string of the inventive concept may include a first string formed between a bitline and a substrate and a second string formed between the substrate and a common source line.

Figure 6:
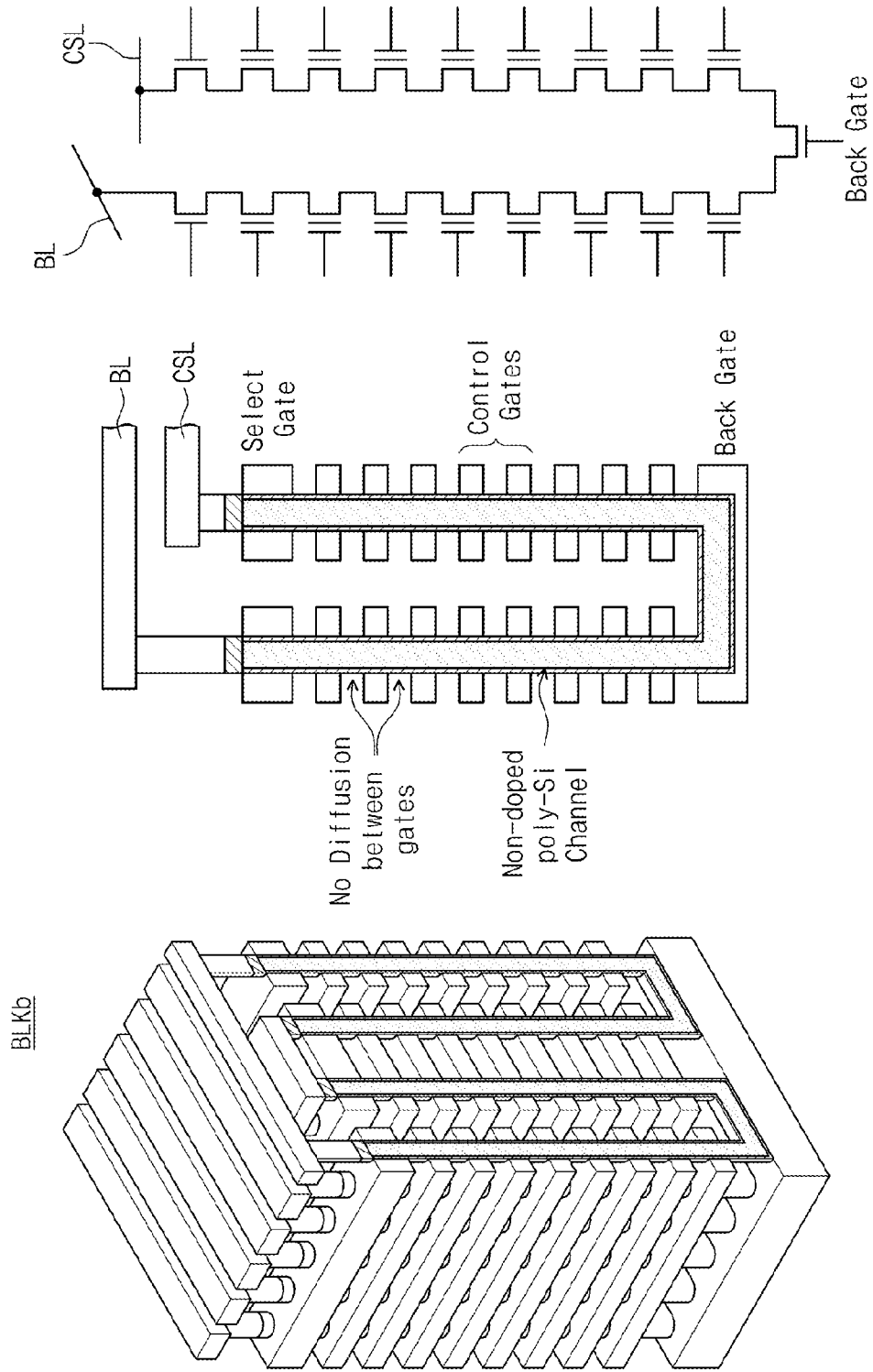
FIG. 6 illustrates a memory block according to another exemplary embodiment of the inventive concept.

FIG. 6 illustrates a memory block according to another exemplary embodiment of the inventive concept. As illustrated, a string may be formed between a bitline BL and a common source line CSL and may include first memory cells formed vertically between the bitline BL and a substrate and second memory cells formed vertically between the substrate and the common source line CSL.

In some embodiments, each of strings may be at least two pillars.

In some embodiments, a memory block BLKb may be implemented using a PBiCS (Pipe—Shaped Bit Cost Scalable) structure.

Figure 7:
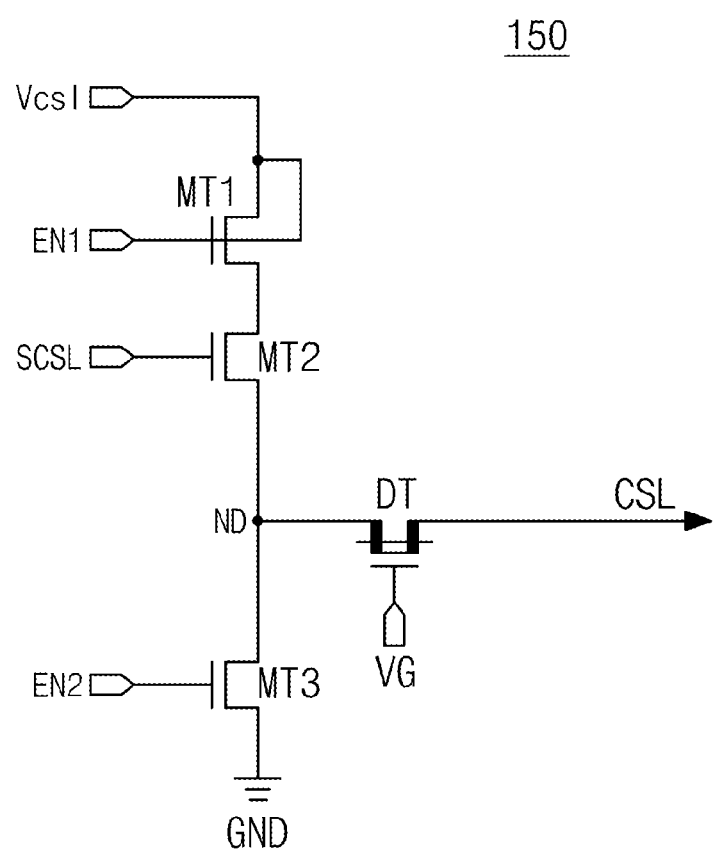
FIG. 7 illustrates a CSL driver according to an exemplary embodiment of the inventive concept.

FIG. 7 illustrates a CSL driver 150 according to an exemplary embodiment of the inventive concept. As illustrated, the CSL driver 150 may include transistors MT1 to MT3 and a depletion transistor DT.

A first transistor MT1 may transfer a CSL voltage Vcs1 to a node ND in response to an enable signal EN1. The node ND is connected to a common source line CSL via a depletion transistor DT. In some embodiments, a body of the first transistor MT1 may be connected to a drain terminal of the first transistor MT1, as shown in FIG. 7. A second transistor MT2 may cut off transfer of the CSL voltage Vcs1 to the common source line in response to a CSL control signal SCSL to float the common source line CSL. A third transistor MT3 may connect the common source line CSL to a ground terminal GND in response to an enable signal EN2. The depletion transistor DT may be coupled between the node ND and the common source line CSL, may include a gate terminal to be applied with a gate voltage VG, and may float the common source line CSL when a voltage of the common source line CSL is equal to or greater than a predetermined value or float the common source line CSL when a voltage of the node ND is equal to or greater than a predetermined value.

The CSL driver 150 may supply the CSL voltage Vcs1 to the common source line CSL in response to the first enable signal EN1, may ground the common source line CSL to the ground terminal GND, and may float the common source line CSL in response to the second enable signal EN2.

The CSL driver 150 shown in FIG. 7 is merely exemplary, and the CSL driver 150 according to the inventive concept may be implemented using various structures.

Figure 8:
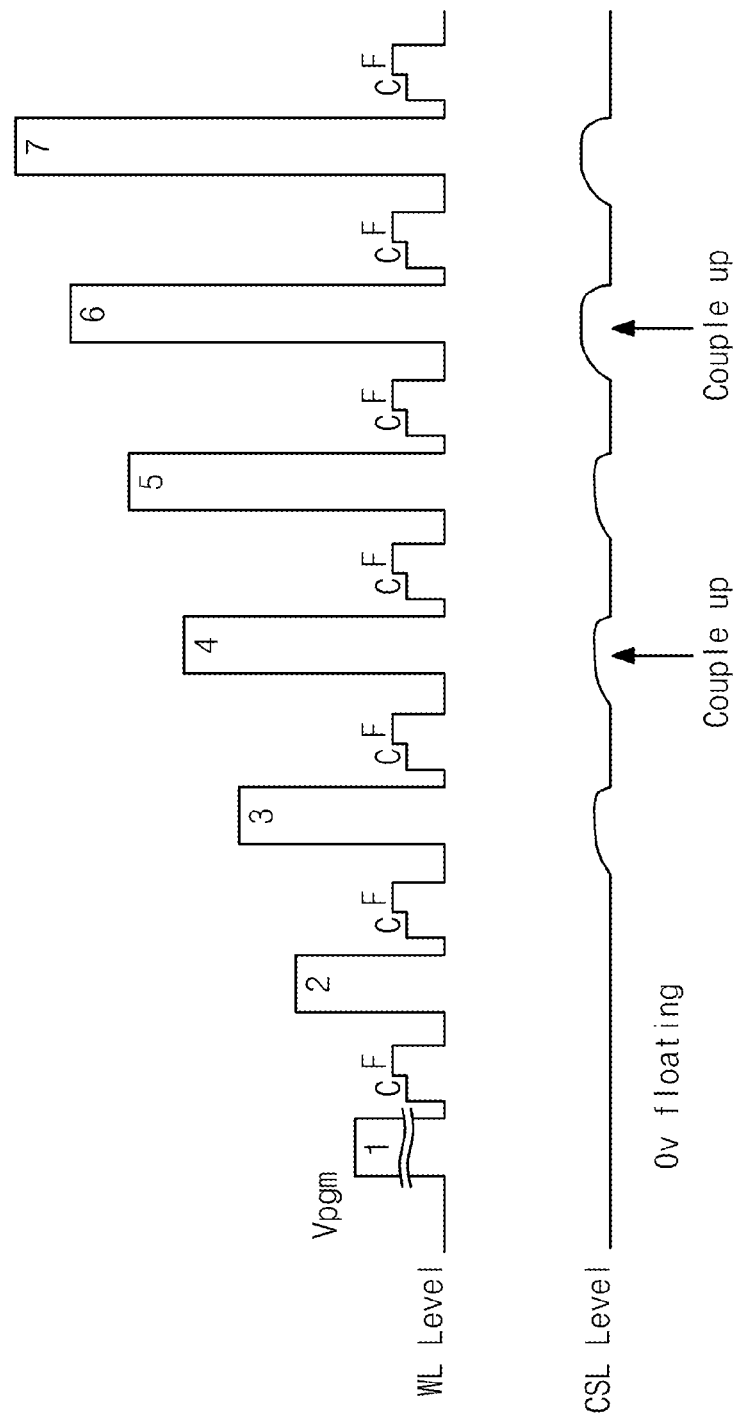
FIG. 8 illustrates CSL level control during a program operation of a nonvolatile memory device according to an exemplary embodiment of the inventive concept.

FIG. 8 illustrates CSL level control during a program operation of a nonvolatile memory device 100 according to an exemplary embodiment of the inventive concept. Referring to FIGS. 1 to 8, as a program loop is executed, the CSL level control may be performed as follows. A common source line CSL is floated during initial program loops 1 and 2. At this point, the level of the common source line CSL may be 0 volt. However, the level of the common source line CSL need not be limited thereto.

There may be a memory cell on which a program operation is completed while passing through the initial program loops 1 and 2. Accordingly, memory cells to be program-inhibited may increase during the next program loop. Thus, the level of the common source line CSL increases to a predetermined value due to bitline coupling even when the common source line CSL is floated during a bitline setup operation before applying program pulses Vpgm of respective program loops 3, 4, and 5. The common source line CSL may be grounded to a ground terminal GND before applying verify pulses C and F of the respective program loops 3, 4, and 5. The verify pulse C is a coarse verify pulse, and the verify pulse F is a fine verify pulse. The verify operation of the inventive concept is not limited thereto, and the coarse verify pulse C may not be applied or may be selectively applied.

As program loops 1, 2, 3, 4, and 5 are much executed, program-completed memory cells may increase rapidly and thus memory cells to be program-inhibited may increase rapidly. As a result, an influence on bitline coupling may increase. Accordingly, the level of the common source line CSL may be made higher than that of the previous program loops 3, 4, and 5 due to coupling during bitline setting operations of the next program loops 6 and 7. Thereafter, the common source line CSL may be connected to the ground terminal GND to be discharged before applying verify pulses C and F of the respective program loops 6 and 7.

In the CSL control of the nonvolatile memory device 100 according to an embodiment of the inventive concept, the common source line CSL may be floated before applying a program pulse Vpgm and may be discharged before applying verify pulses C and F.

On the other hand, a nonvolatile memory device according to an embodiment of the inventive concept may be implemented to sense the level of a common source line CSL such that floating of the common source line CSL may be controlled.

Figure 9:
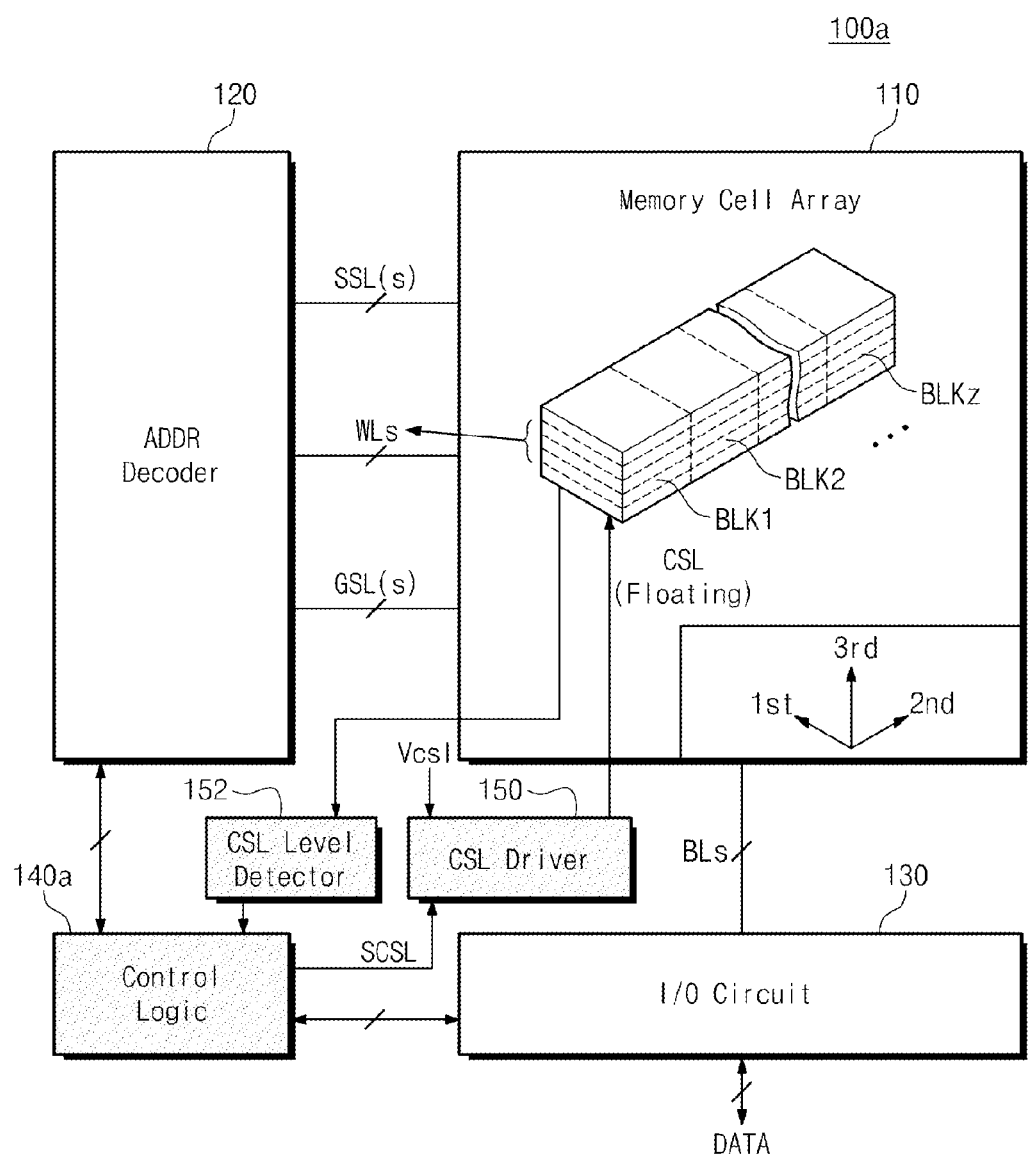
FIG. 9 illustrates a nonvolatile memory device according to another embodiment of the inventive concept.

FIG. 9 illustrates a nonvolatile memory device 100a according to another embodiment of the inventive concept. As illustrated, the nonvolatile memory device 100a includes a memory cell array 110, an address decoder 120, an input/output (I/O) circuit 130, a control logic 140a, a CSL driver 150, and a CSL level detector 152. The nonvolatile memory device 110a further includes the CSL level detector 152, as compared to the nonvolatile memory device 100 shown in FIG. 1.

The CSL level detector 152 detects the level of a common source line CSL. The control logic 140a may generate a CSL control signal SCSL to decide whether or not to float the common source line CSL using the detected level of the common source line CSL. For example, when the level of the common source line CSL is equal to or greater than a predetermined value during a program operation, a CSL control signal SCSL may be generated to float the common source line.

On the other hand, a nonvolatile memory device according to an embodiment of the inventive concept may be implemented to control floating of a common source line CSL based on a temperature of a memory cell array.

Figure 10:
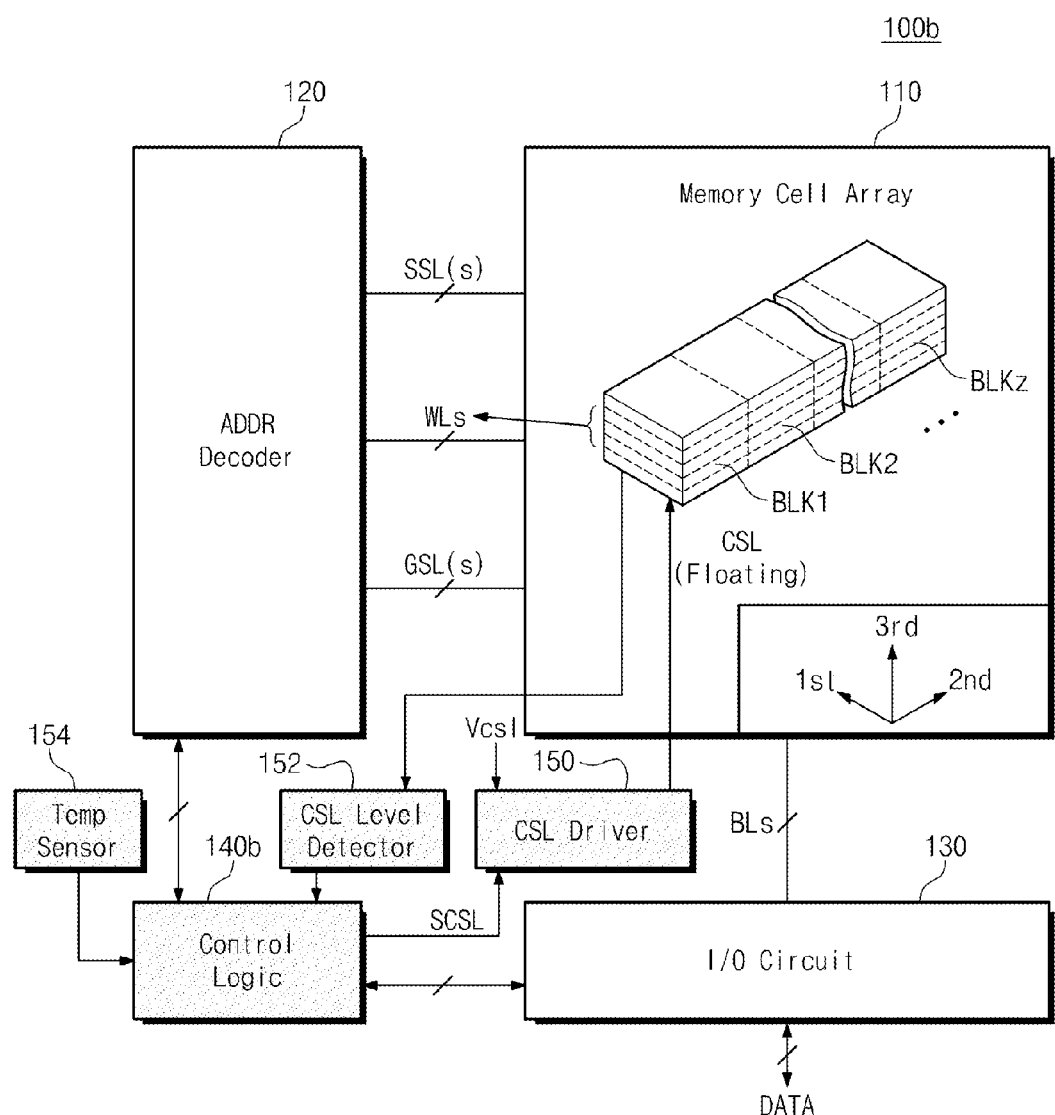
FIG. 10 illustrates a nonvolatile memory device according to another embodiment of the inventive concept.

FIG. 10 illustrates a nonvolatile memory device 100b according to another embodiment of the inventive concept. As illustrated, the nonvolatile memory device 100b includes a memory cell array 110, an address decoder 120, an input/output circuit 130, a control logic 140b, a CSL driver 150, a CSL level detector, and a temperature sensor 154. The nonvolatile memory device 110b further includes the temperature sensor 154, as compared to the nonvolatile memory device 100 shown in FIG. 9.

The temperature sensor 154 senses a temperature of the memory cell array 110 to output a corresponding value. The control logic 140b may generate a CSL control signal SCSL to determine whether a common source line CSL is floated, based on a value corresponding to the level of the common source line CSL output from the CSL level detector 140 and a temperature value output from the temperature sensor 154. For example, when the level of the common source line CSL is equal to or greater than a predetermined value and a temperature of the memory cell array 110 is equal to or greater than a predetermined value during a program operation, the CSL control signal SCSL may be generated to float the common source line CSL. To put it another way, the level of the common source line CSL output from the CSL level detector 142 may be compensated according to the temperature of the memory cell array 110.

Figure 11:
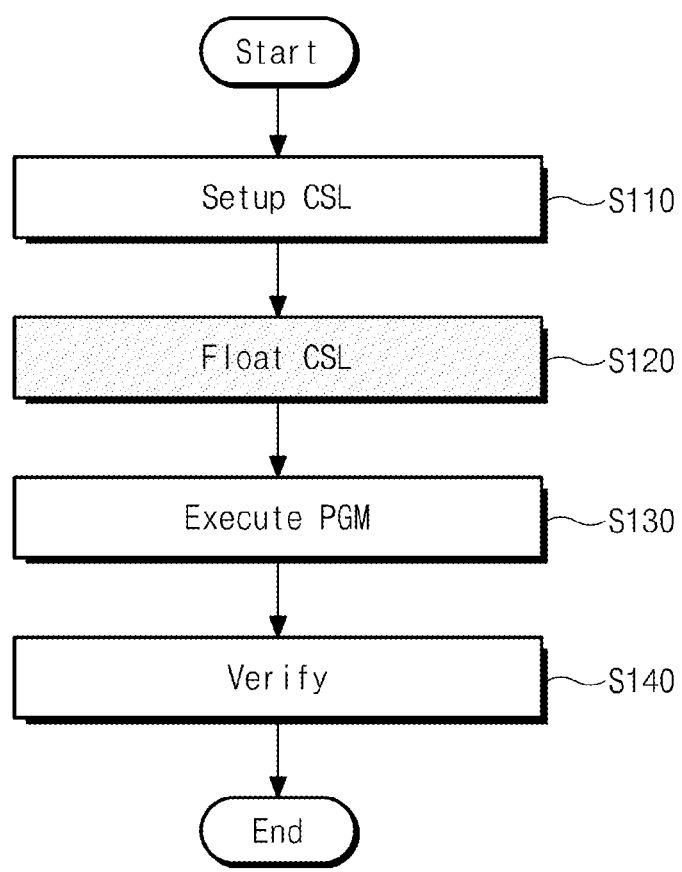
FIG. 11 illustrates a first embodiment of a programming method of a nonvolatile memory device according to the inventive concept.

FIG. 11 illustrates a first embodiment of a programming method of a nonvolatile memory device according to the inventive concept. Referring to FIGS. 1 to 11, a programming method of a nonvolatile memory device will now be described. A common source line CSL is set up to a predetermined value. The predetermined value may be 0 volt, as shown in FIG. 7 (S110). The setup common source line CSL is floated (S120). A program operation is executed by applying a program pulse to a selected wordline (S130). A verify operation is executed to whether the program operation is properly executed (S140).

According to the above-described programming method, a program operation may be performed after floating a common source line CSL of a predetermined value.

On the other hand, the programming method may further include determining whether the common source line CSL is floated.

Figure 12:
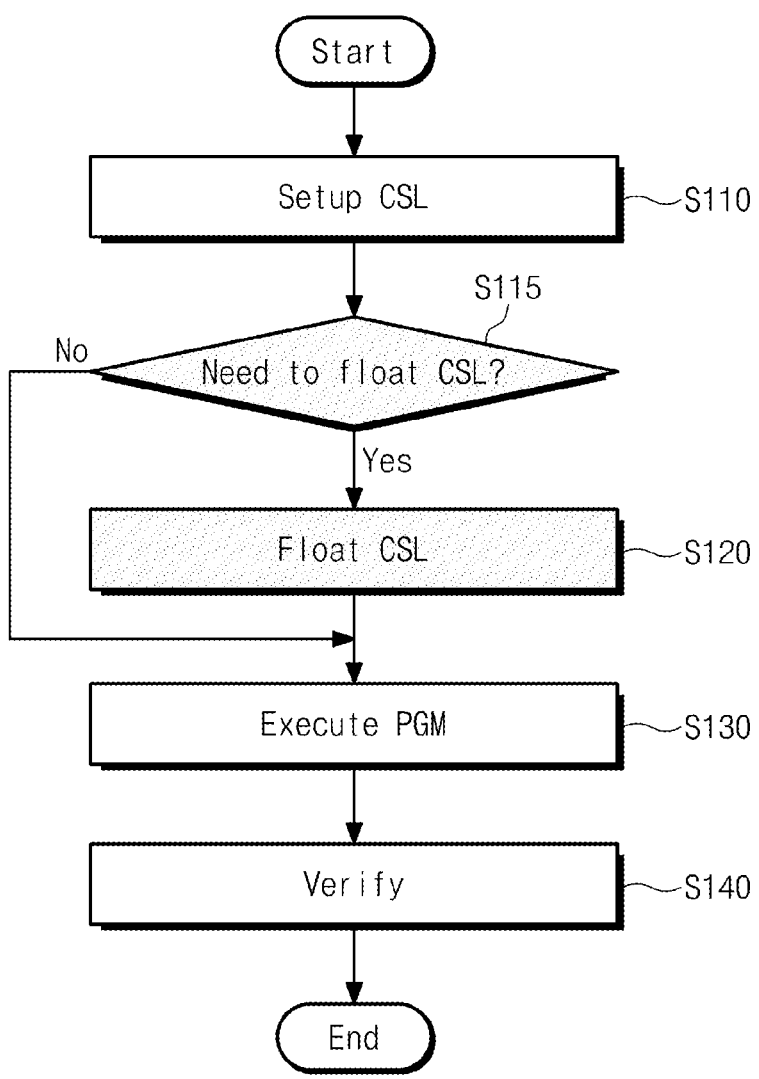
FIG. 12 illustrates a second embodiment of a programming method of a nonvolatile memory device according to the inventive concept.

FIG. 12 illustrates a second embodiment of a programming method of a nonvolatile memory device according to the inventive concept. Referring to FIG. 12, the programming method may further include determining whether a common source line CSL need to be floated (S115), as compared to the programming method described with reference to FIG. 11. If the common source line CSL need not be floated, the flow proceeds to S130.

The determination on whether the common source line CSL need to be floated may be made depending on environmental information such as the number of program loops, the level of the common source line CSL, a temperature of a memory cell array, and the like.

The above-described programming method may include determining whether a common source line CSL is floated.

Figure 13:
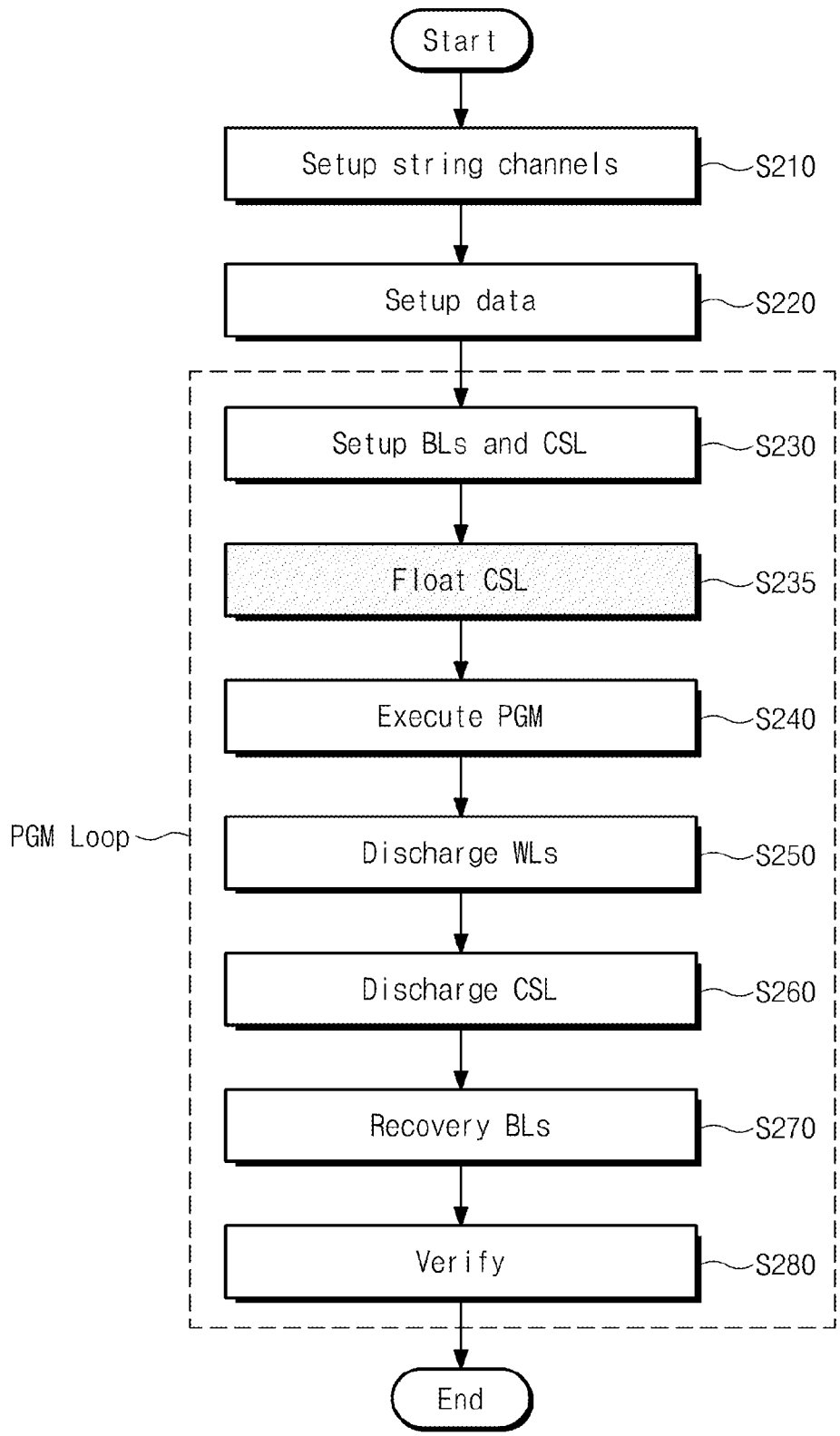
FIG. 13 illustrates a third embodiment of a programming method of a nonvolatile memory device according to the inventive concept.

FIG. 13 illustrates a third embodiment of a programming method of a nonvolatile memory device according to the inventive concept. Referring to FIGS. 1 to 10 and FIG. 13, a programming method of a nonvolatile memory device will now be described.

Channels of selected strings and unselected strings will be setup (S210). Charges included in a channel may be discharged to a ground terminal GND during the setup operation of the channels. Data to be programmed may be set up to an I/O circuit 130 (see FIG. 1). A plurality of page buffers included in the I/O circuit 130 receives the data to be programmed and performs a dumping operation on input data, if necessary (S220). Then a program loop may be executed. The program loop is executed from S230 to S280 and may be repeated by applying a program pulse Vpgm to a predetermined value when a program operation, as a result of the verify operation, is not completed.

The steps of the program loop will now be described. Bitlines BLs and a common source line CSL may be set up. For example, bitlines connected to a memory cell to be programmed may be set up to 0 volt, and a bitline connected to a memory cell to be program-inhibited may be set up to a power supply voltage VDD. The common source line CSL may be set up to a predetermined value, e.g., 0 volt (S230).

The common source line CSL may be floated. The floating of the common source line CSL may be done by default or optionally (S235). A program operation is executed by applying a program pulse Vpgm, i.e., program voltage to a selected wordline and applying a program pass voltage to unselected wordlines (S240).

Charges of the wordlines WLs may be discharged to execute a verify operation (S250). In some embodiments, a discharge operation of the common source line CSL may be executed in step-type or lamp-type. A recovery operation may be performed on the bitlines BLs (S2170). A verify operation may be executed by applying verify pulses C and F to verify whether programmed memory cells connected to the selected wordline are properly programmed (S280).

In FIG. 13, a discharge operation of the common source line CSL is executed following a discharge operation of the wordlines WLs. However, the program operation of the inventive concept is not limited thereto. The discharge operation of the wordlines WLs may be executed following the discharge operation of the common source line CSL.

Figure 14:
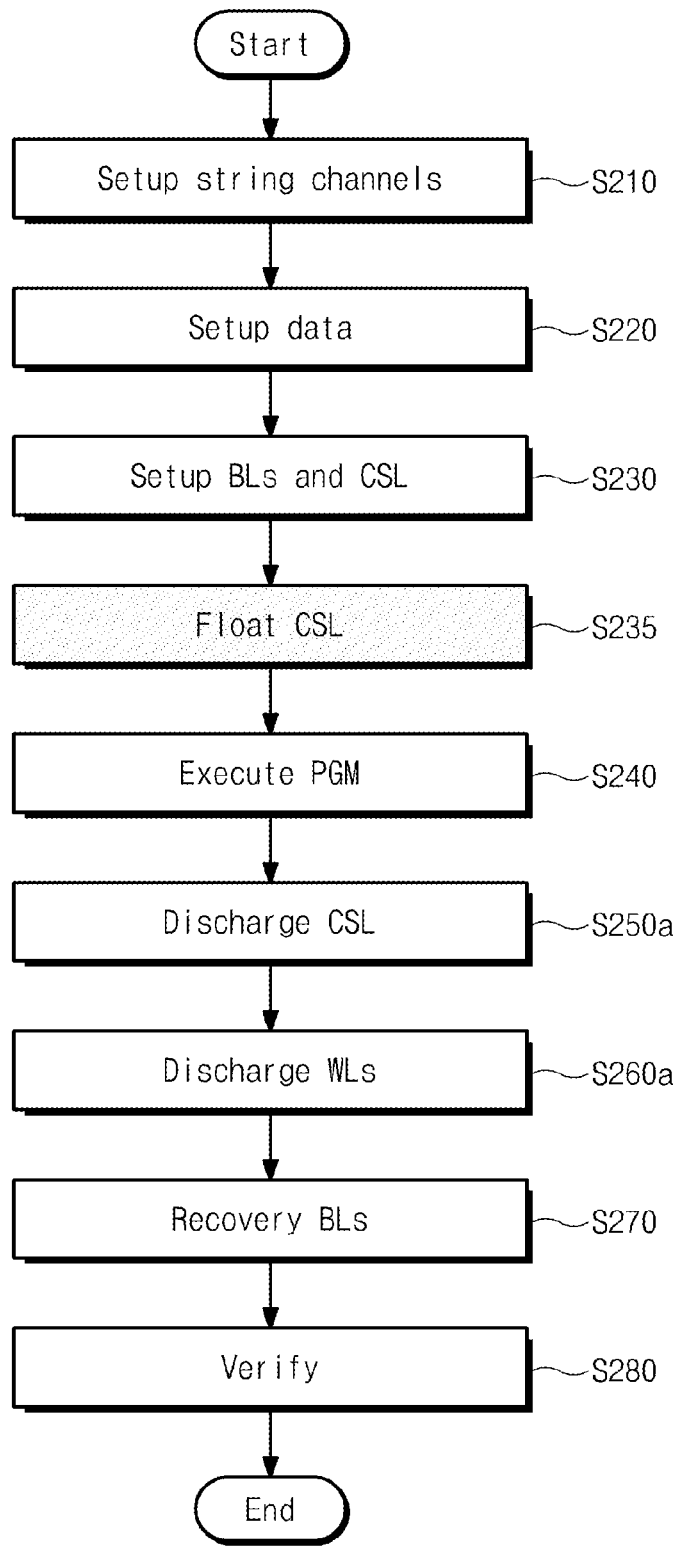
FIG. 14 illustrates a fourth embodiment of a programming method of a nonvolatile memory device according to the inventive concept.

FIG. 14 illustrates a fourth embodiment of a programming method of a nonvolatile memory device according to the inventive concept. Referring to FIGS. 1 to 10 and FIG. 14, a programming method of a nonvolatile memory device is different in S250a and S250b from the programming method described with reference to FIG. 13. In the programming method according to this embodiment, wordlines WLs are discharges (S260a) after a common source line CSL is discharged (S250a).

Figure 15:
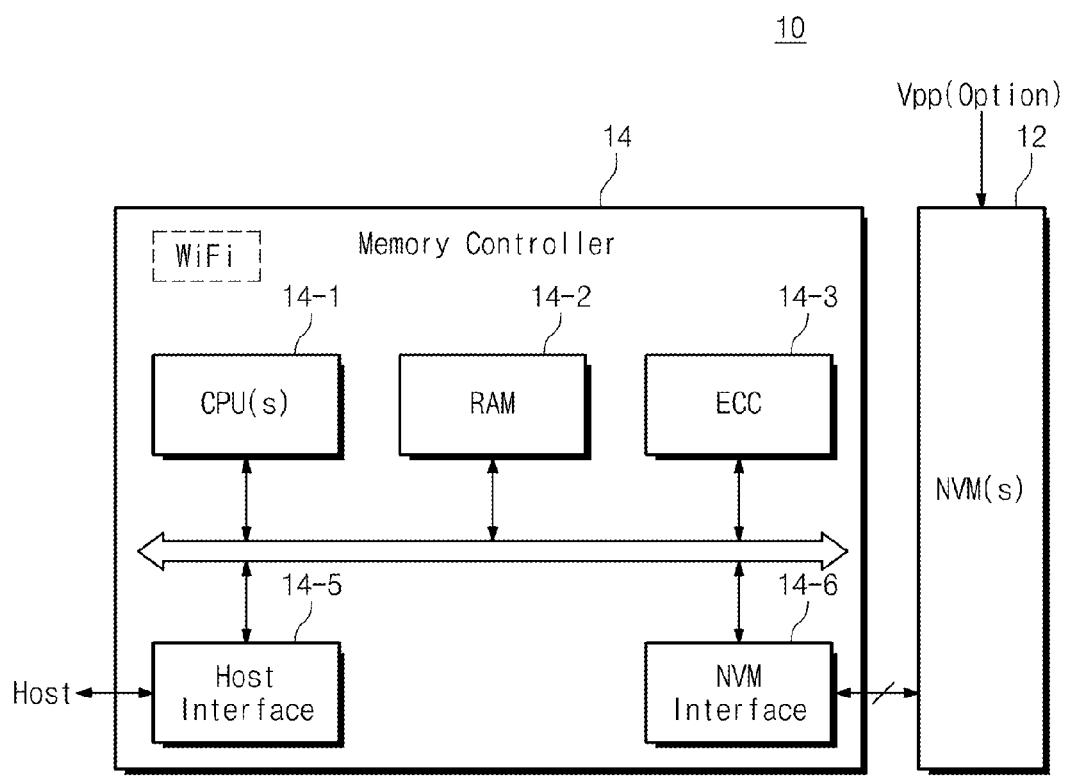
FIG. 15 is a block diagram of a storage device according to an exemplary embodiment of the inventive concept.

FIG. 15 is a block diagram of a storage device 10 according to an exemplary embodiment of the inventive concept. As illustrated, the storage device 10 includes at least one nonvolatile memory device 12 and a memory controller 14 to control the nonvolatile memory device 12. The storage device 10 may be a storage medium such as a memory card (e.g., CF, SD, microSD, etc.) and a USB storage device.

The nonvolatile memory device 12 may be implemented using the nonvolatile memory devices 100, 100a, and 100b described with reference to FIGS. 1 to 14.

The memory controller 14 controls read, write, and erase operation of the nonvolatile memory device 12 in response to a host request. The memory controller 14 includes at least one central processing unit (CPU) 14-1, a random access memory (RAM) 14-2, an error correction code (ECC) circuit 14-3, a host interface 14-5, and a nonvolatile memory (NVM) interface 14-6.

The CPU 14-1 may control the overall operation (e.g., read, write, file system management, bad page management, etc.) of the nonvolatile memory device 12. The RAM 14-2 operates according to control of the CPU 14-1 and may be used as a work memory, a buffer memory, and a cache memory. When the RAM 14-2 is used as a work memory, data processed by the CPU 14-1 is temporarily stored. When the RAM 14-2 is used as a buffer memory, it buffers data to be transferred from a host to the nonvolatile memory device and/or transferred from the nonvolatile memory device 12 to the host. When the RAM 14-2 is used as a cache memory, it enables a low-speed nonvolatile memory device 12 to operate at high speed.

The ECC circuit 14-3 generates an error correction code (ECC) to correct a fail bit or an error bit of data received from the nonvolatile memory device 12. The ECC circuit 14-3 performs error correction encoding on data provided to the nonvolatile memory device 12 to generate data to which a parity bit is added. The parity bit may be stored in the nonvolatile memory device 12. The ECC circuit 14-3 may perform error correction decoding on data output from the nonvolatile memory device 12. The ECC circuit 14-3 may correct an error using a parity. The ECC circuit 14-3 may correct an error using coded modulation such as low density parity check (LDPC) code, BCH code, turbo code, Reed-Solomon code, convolution code, recursive systematic code (RSC), trellis-coded modulation (TCM), block coded modulation (BCM).

The memory controller 14 exchanges data with a host via the host interface 14-5 and exchanges data with the nonvolatile memory device 12 via the NVM interface 14-6. The host interface 14-5 may be connected to the host via a parallel AT attachment bus (PATA), a serial AT attachment bus (SATA), SCSI, USB, PCIe, a NAND interface.

In some embodiments, the memory controller 14 may accommodate a wireless communication function (e.g., WiFi).

As described above, a nonvolatile memory device according to an embodiment of the inventive concept starts a CSL level control method for improving a program distribution. In general, a common source line (CSL) is set up to a constant level during a program operation for improving program inhibit boosting efficiency. However, in a 3D-NAND structure with high CSL capacitance, CSL setup time increases and thus the CSL level may be set up even during a program period. This may have an influence on program characteristics due to coupling between the CSL and a bitline (BL). The nonvolatile memory device may control the CSL level during a program period to mitigate the above side effect.

A nonvolatile memory device according to the inventive concept may float a common source line (CSL) after setting up the level of the CSL. Thus, coupling between the CSL and a bitline may be minimized to prevent reduction of incremental step pulse programming (ISPP) effect. For example, the CSL may be automatically floated after being set up to a predetermined voltage or the CSL may be set up after predetermined time has elapsed.

The inventive concept may be applied to a solid-state drive (SSD).

Figure 16:
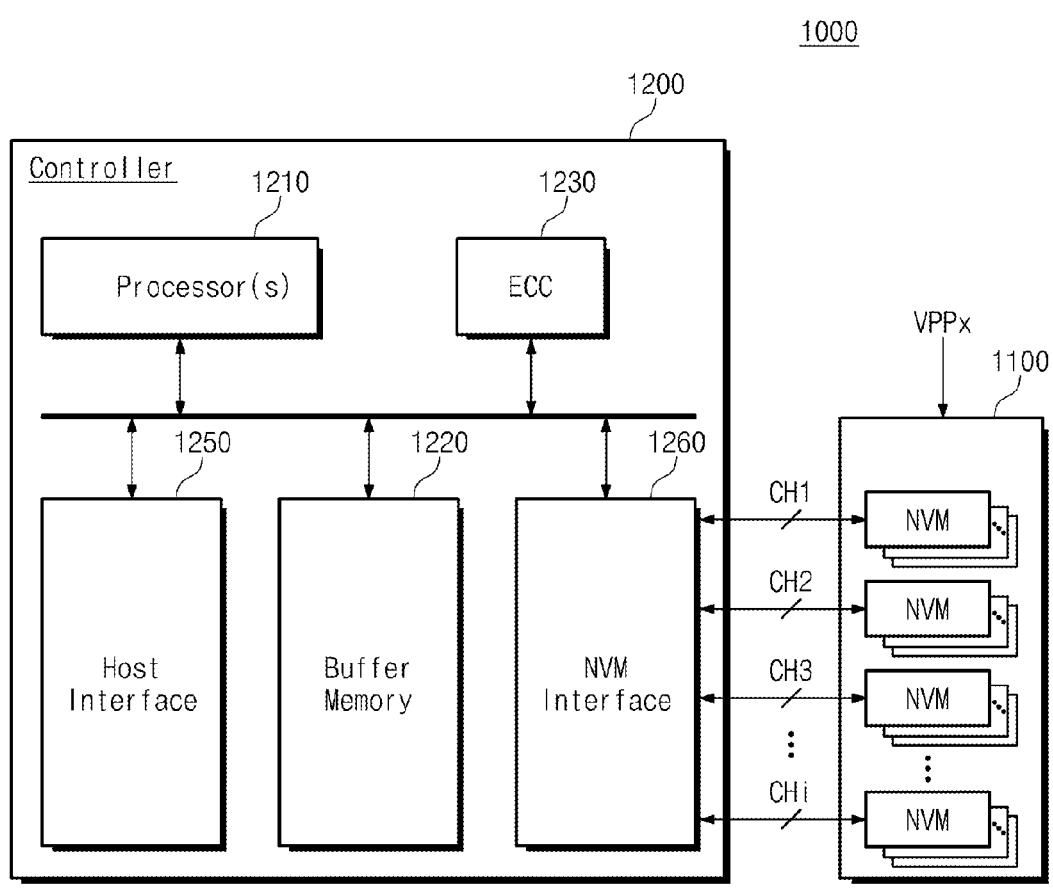
FIGS. 16, 17, 18 and 19 illustrate respective application examples of the inventive concept.

FIG. 16 illustrates an application example of an SSD 1000 according to the inventive concept. As illustrated, the SSD 1000 includes a plurality of nonvolatile memory devices 1100 and an SSD controller 1200.

The nonvolatile memory devices 1100 may be implemented to optionally receive an external high voltage Vpp. Each of the nonvolatile memory devices 1100 may be implemented to execute a program operation after floating a common source line CSL, as described with reference to FIGS. 1 to 14. The SSD controller 1200 is connected to the nonvolatile memory devices 1100 vias a plurality of channels CH1 to CHi (i being an integer equal to or greater than 2). The SSD controller 1200 includes at least one processor 1210, a buffer memory 1220, an error correction code (ECC) circuit 1230, a host interface 1250, and a nonvolatile memory interface 1260.

The buffer memory 1220 may temporarily store data required to drive the memory controller 1200. The buffer memory 1220 may include a plurality of memory lines to store data or a command. The memory lines may be mapped to cache lines by various methods. The ECC circuit 1230 may calculate an ECC value of data to be programmed during a write operation, correct an error of data read during a read operation based on the ECC value, and correct an error of restored data from the nonvolatile memory device 1100 during a data restore operation. Although not shown, the SSD controller 1200 may further include a code memory storing code data required to drive the memory controller 1200. The code memory may be implemented using a nonvolatile memory device.

The host interface 1250 may provide an interface function with an external device. The host interface 1250 may be a NAND flash interface. The host interface 1250 may be implemented using various interfaces, other than the NAND flash interface. The nonvolatile memory interface 1260 may provide an interface function with the nonvolatile memory device 1100.

The SSD 1000 executes a program operation after floating a common source line CSL. Thus, bitline coupling may be minimized to expect improvement in program speed.

The inventive concept may be applied to an embedded multimedia card (eMMC), a moviNAND flash memory, and an iNAND flash memory.

Figure 17:
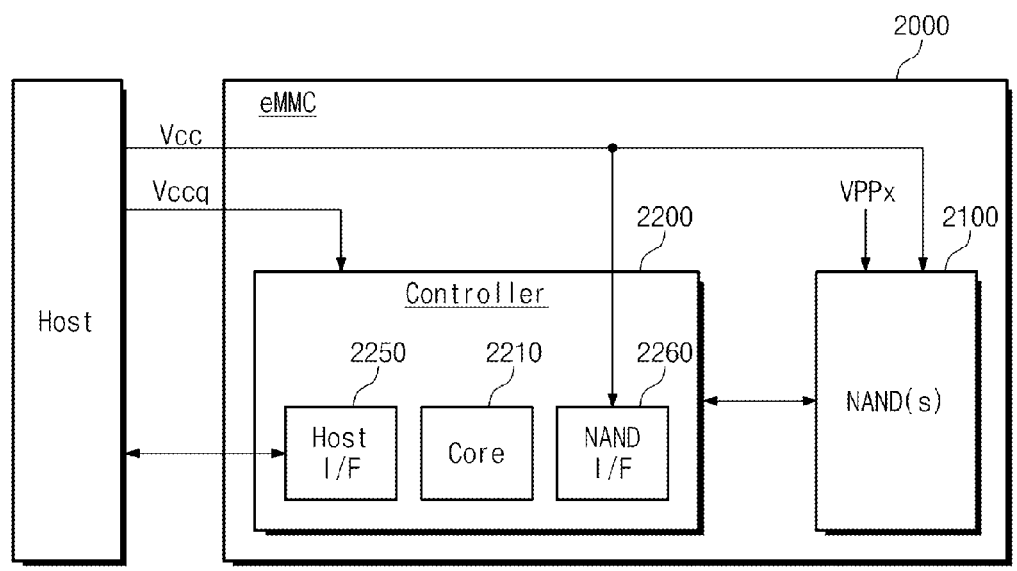

FIG. 17 illustrates an application example of an eMMC 2000 according to the inventive concept. As illustrated, the eMMC 2000 may include at least one NAND flash memory device 2100 and a controller 2200.

The NAND flash memory device 2100 may be implemented to execute a program operation such that a common source line CSL is controlled to minimize coupling between the common source line CSL and a bitline, as described with reference to FIGS. 1 to 14. The controller 2200 is connected to the NAND flash memory device 2100 through a plurality of channels. The controller 2200 includes at least one control core 2210, a host interface 2250, and a NAND interface 2260. The at least one control core 2210 controls the overall operation of the eMMC 2000. The host interface 2250 performs host interfacing with the controller 2210. The NAND interface 2260 performs interfacing between the NAND flash memory device 2100 and the controller 2200. In some embodiments, the host interface 2250 may be a parallel interface (e.g., MMC interface). In other embodiments, the host interface 2250 may be a serial interface (e.g., UHS-II or UFS interface). In other embodiments, the host interface 2250 may be a NAND interface.

The eMMC 2000 receives power supply voltages Vcc and Vccq from a host. A first power supply voltage Vcc (e.g., 3.3 volts) is supplied to the NAND flash memory device 1100 and the NAND interface 1230, and a second power supply voltage Vccq (e.g., 1.8 volts/3.3 volts) is supplied to the controller 1200. In some embodiments, the eMMC 1000 may optionally receive an external high voltage Vpp.

In order to improve program speed, the eMMC 2000 may control whether the common source line CSL is floated.

The inventive concept may be applied to a universal flash storage (UFS).

Figure 18:
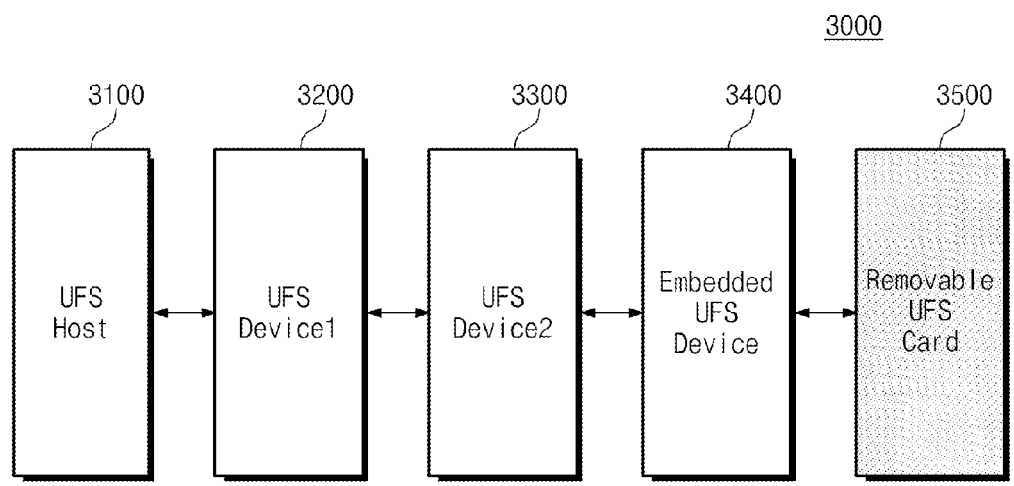

FIG. 18 illustrates an application example of a UFS system 3000 according to the inventive concept. As illustrated, the UFS system 3000 may include a UFS host 3100, UFS devices 3200 and 3300, an embedded UFS device 3300, and a removable UFS card 3400. The UFS 3100 may be an application processor for a mobile device. The UFS host 3100, the UFS devices 3200 and 3300, the embedded UFS device 3300, and the removable UFS card 3400 may communicate with external devices by means of a UFS protocol, respectively. At least one of the UFS devices 3200 and 3300, the embedded UFS device 3300, and the removable UFS card 3400 may be implemented using the storage device 10 shown in FIG. 15.

The embedded UFS device 3300 and the removable UFS card 3400 may communicate with each other by means of another protocol, other than the UFS protocol. The UFS host 3100 and the removable UFS card 3400 may communicate with each other by means of various card protocols (e.g., UFDs, MMC, secure digital (SD), mini SD, micro SD, etc.).

The inventive concept may be applied to a mobile device.

Figure 19:
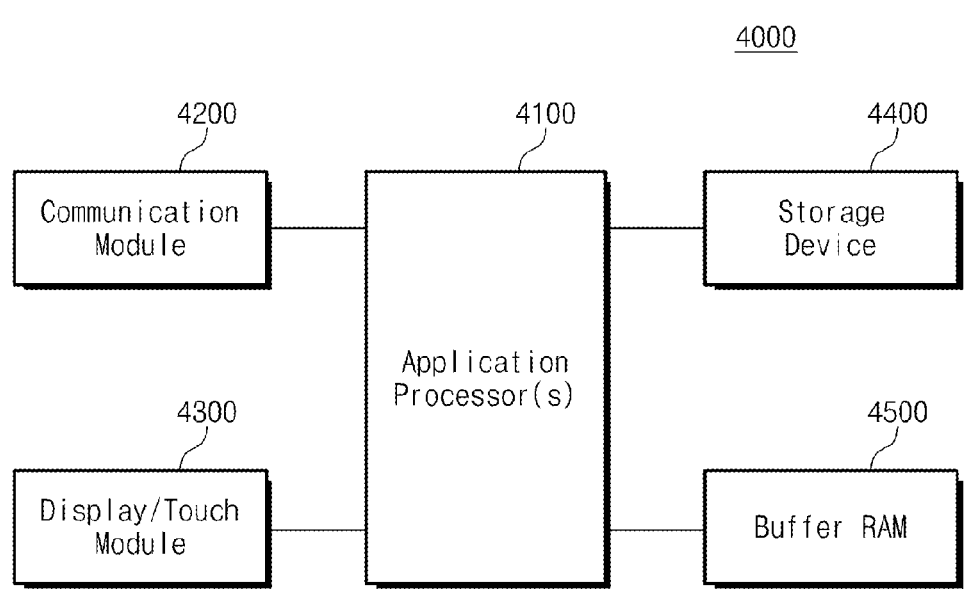

FIG. 19 illustrates an application example of a mobile device 4000 according to the inventive concept. As illustrated, the mobile device 4000 may include an application processor 4100, a communication module 4200, a display/touch module 4300, a storage device 4400, and a mobile RAM 4500.

The application processor 4100 controls the overall operation of the mobile device 4000. The communication module 4200 may be implemented to control wired/wireless communication with an external entity. The display/touch module 4300 may be implemented to display data processed by the application processor 4100 or receive data from a touch panel. The storage device 4400 may be implemented to store user data. The storage device 4400 may be an eMMC, an SSD or a UFS device. The storage device 4400 may be implemented to control a common source line CSL to improve program speed. The mobile RAM 4500 may be implemented to temporarily store data required during a processing operation of the mobile device 4000.

The mobile device 4000 includes the storage device 4400 to improve program speed, contriving improvement in system performance.

A memory system or a storage device according to an embodiment of the inventive concept may be packaged according to any of various packaging technologies. For example, the memory system or the storage device may be packaged by one of PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

According to the above-described nonvolatile memory device and a programming method thereof, a common source line is floated after being set up to a predetermined voltage. Thus, coupling between a bitline and the common source line is reduced to improve program speed.

While the present disclosure has been particularly shown and described with reference to exemplary embodiments thereof, it will be understood by those of ordinary skill in the art that various changes in form and details may be made therein without departing from the spirit and scope of the present disclosure as defined by the following claims. For example, it is possible to adjust the driving capability of a sub word line driver or adjust the slope of level of applied driving signals by changing, adding, or removing the circuit configuration or arrangement in the drawings without departing from the technical spirit of the present disclosure in other cases.

What is claimed is:

1. A method of programming a nonvolatile memory device including a plurality of strings disposed perpendicular to a substrate and connected between bitlines and a common source line, the programming method comprising:
    setting the common source line to a predetermined voltage;
    floating the common source line after setting the common source line to the predetermined voltage;
    performing a program operation on memory cells connected to a selected wordline after floating the common source line; and
    performing a verify operation on the memory cells to determine whether the program operation was successful.

2. The method of claim 1, wherein the predetermined voltage is 0 volt.

3. The method of claim 1, wherein setting the common source line to the predetermined voltage is carried out while setting the bitlines to another predetermined voltage.

4. The method of claim 1, further comprising determining whether the common source line is floated after setting the common source line.

5. The method of claim 4, wherein determining whether the common source line is floated comprises:
    detecting a voltage level of the common source line; and
    determining whether or not to float the common source line according to the detected voltage level of the common source line.

6. The method of claim 4, wherein determining whether the common source line is floated comprises:
    detecting a voltage level of the common source line;
    sensing a temperature of the nonvolatile memory device;
    compensating the detected voltage level of the common source line according to the sensed temperature; and
    determining whether or not to float the common source line according to the compensated detected level of the common source line.

7. The method of claim 1, further comprising discharging wordlines, which are electrically connected to the plurality of strings, after performing the program operation.

8. The method of claim 7, further comprising discharging the common source line after discharging the wordlines.

9. The method of claim 4, further comprising recovering the bitlines after discharging the common source line.

10. A nonvolatile memory device comprising:
    a memory cell array including a plurality of memory blocks including a plurality of strings disposed perpendicular to a substrate and coupled between bitlines and a common source line;

an address decoder configured to select any one of the memory blocks in response to receiving an address;

an input/output circuit, configured to store data to be programmed into memory cells, connected to a selected wordline among wordlines of the selected memory block during a program operation and store data read from memory cells connected to the selected wordline during a verify operation;

a common source line driver configured to float the common source line after setting the common source line to a predetermined voltage; and a control logic configured to control the address decoder, the input/output circuit, and the common source line driver during the program operation and the verify operation, wherein the input/output circuit performs the program operation on the memory cells connected to the selected wordline after setting the common source line to the predetermined voltage and subsequently floating the common source line.

11. The nonvolatile memory device of claim 10, wherein the predetermined voltage varies depending on the number of program loops that have been executed in an incremental step pulse programming operation.

12. The nonvolatile memory device of claim 11, wherein the common source line is floated when the number of program loops is equal to or less than a predetermined value.

13. The nonvolatile memory device of claim 10, further comprising:

a common source line level detector configured to detect a voltage level of the common source line, wherein the control logic determines whether or not to float the common source line based upon the detected voltage level of the common source line.

14. The nonvolatile memory device of claim 10, further comprising:

a temperature sensor configured to sense a temperature of the memory cell array, wherein the control logic determines whether or not to float the common source line based upon the sensed temperature of the memory cell array.

15. The nonvolatile memory device of claim 10, wherein the common source line driver comprises:

a first transistor configured to apply a common source line voltage to the common source line in response to a first enable signal;

a second transistor configured to float the common source line in response to a common source line control signal; and a third transistor configured to connect the common source line to a ground terminal in response to a second enable signal.

16. A storage device comprising:

at least one nonvolatile memory device including a plurality of memory blocks each including a plurality of strings formed in a direction perpendicular to a substrate and connected between bit lines and a common source line; and a memory controller configured to control the at least one nonvolatile memory device, wherein the common source line is set to a predetermined voltage and then is floated prior to executing a program operation.

17. The storage device of claim 16, further comprising a common source line driver configured to float the common source line after setting the common source line to the predetermined voltage.

18. The storage of claim 16, wherein the memory controller determines whether or not to float the common source line.

19. The storage of claim 18, wherein the common source line is floated according to a temperature of the at least one nonvolatile memory device.

20. The storage of claim 19, further comprising a temperature sensor configured to sense the temperature of at least one nonvolatile memory device.

* * * * *